(12) United States Patent
Ge et al.

(10) Patent No.: US 11,320,379 B2
(45) Date of Patent: May 3, 2022

(54) SELS NANO FINGER SIDEWALL COATING LAYER

(71) Applicant: Hewlett-Packard Development Company, L.P., Houston, TX (US)

(72) Inventors: Ning Ge, Palo Alto, CA (US); Milo Overbay, Corvallis, OR (US); James Abbott, Corvallis, OR (US); Anita Rogacs, San Diego, CA (US); Viktor Shkolnikov, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 857 days.

(21) Appl. No.: 16/074,331

(22) PCT Filed: Apr. 21, 2016

(86) PCT No.: PCT/US2016/028683
§ 371 (c)(1),
(2) Date: Jul. 31, 2018

(87) PCT Pub. No.: WO2017/184155
PCT Pub. Date: Oct. 26, 2017

(65) Prior Publication Data
US 2021/0190687 A1  Jun. 24, 2021

(51) Int. Cl.
*G01N 21/64* (2006.01)
*B82Y 15/00* (2011.01)
(Continued)

(52) U.S. Cl.
CPC ............ *G01N 21/648* (2013.01); *B82Y 15/00* (2013.01); *B82Y 40/00* (2013.01); *G01N 21/658* (2013.01);
(Continued)

(58) Field of Classification Search
CPC ....... C23C 16/44; C23C 16/50; C23C 16/455; G01N 21/648; G01N 21/658; B82Y 40/00;
(Continued)

(56) References Cited

U.S. PATENT DOCUMENTS 8,767,202 B2   7/2014 Schmidt et al.
9,001,322 B2   4/2015 Erickson et al.
(Continued)

FOREIGN PATENT DOCUMENTS

CN   101400976   4/2009
CN   102947681   2/2013
(Continued)

OTHER PUBLICATIONS

Lingwei et al.; Aug. 12, 2015; :Silver Nanorods Wrapped with Ultrathin Al2O3 Layers Exhibiting Excellent SERS Sensitivity and Outstanding SERS Stability; http://www.ncbi.nlm.nih.gov/pmc/articles/PMC4533008/; Accessed online Jun. 2, 2016.

*Primary Examiner* — Michael B Cleveland
*Assistant Examiner* — Michael G Miller
(74) *Attorney, Agent, or Firm* — Tong Rea Bentley & Kim LLC

(57) ABSTRACT

A surface enhanced luminescence (SELS) sensor may include a substrate and nano fingers projecting from the substrate. Each of the nano fingers may include a polymer pillar having a sidewall and a top, a coating layer covering the sidewall and a metal cap supported by and in contact with the top of the pillar.

8 Claims, 3 Drawing Sheets

(51) Int. Cl.
  *B82Y 40/00* (2011.01)
  *G01N 21/65* (2006.01)
  *B05D 5/08* (2006.01)
  *B82Y 30/00* (2011.01)
  *C23C 16/44* (2006.01)
  *C23C 16/455* (2006.01)
  *C23C 16/50* (2006.01)

(52) U.S. Cl.
  CPC ...... *B05D 5/083* (2013.01); *B81B 2203/0361* (2013.01); *B82Y 30/00* (2013.01); *C23C 16/44* (2013.01); *C23C 16/455* (2013.01); *C23C 16/50* (2013.01)

(58) Field of Classification Search
  CPC ........ B82Y 15/00; B82Y 30/00; B05D 5/083; B81B 2203/0361
  See application file for complete search history.

(56) References Cited

U.S. PATENT DOCUMENTS

| | | |
|---|---|---|
| 2006/0164634 A1 | 7/2006 | Kamins et al. |
| 2007/0153267 A1* | 7/2007 | Wang .................... G01N 21/658 356/301 |
| 2007/0252979 A1 | 11/2007 | Bratkovski et al. |
| 2008/0145773 A1* | 6/2008 | Wang .................... G03F 7/0002 430/22 |
| 2008/0285039 A1* | 11/2008 | Que ..................... G01N 21/648 356/445 |
| 2010/0193768 A1 | 8/2010 | Habib |
| 2013/0070241 A1* | 3/2013 | Li ........................ G01N 21/658 356/301 |
| 2014/0024131 A1* | 1/2014 | Kim ....................... G01N 21/00 436/172 |

FOREIGN PATENT DOCUMENTS

| | | |
|---|---|---|
| CN | 104937391 | 9/2015 |
| EP | 2948757 | 12/2015 |
| WO | WO-2012087352 | 6/2012 |
| WO | WO-2012088209 | 6/2012 |
| WO | WO-2015026297 A1 | 2/2015 |
| WO | WO-2015141885 A1 | 9/2015 |

* cited by examiner

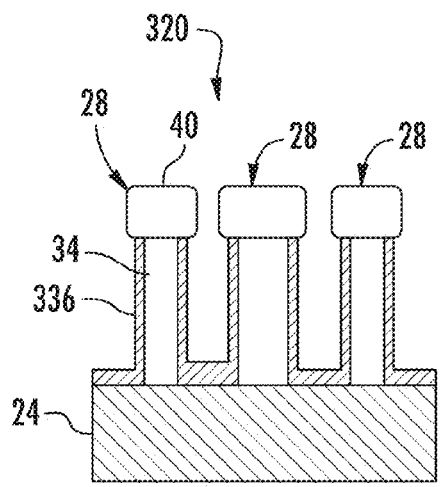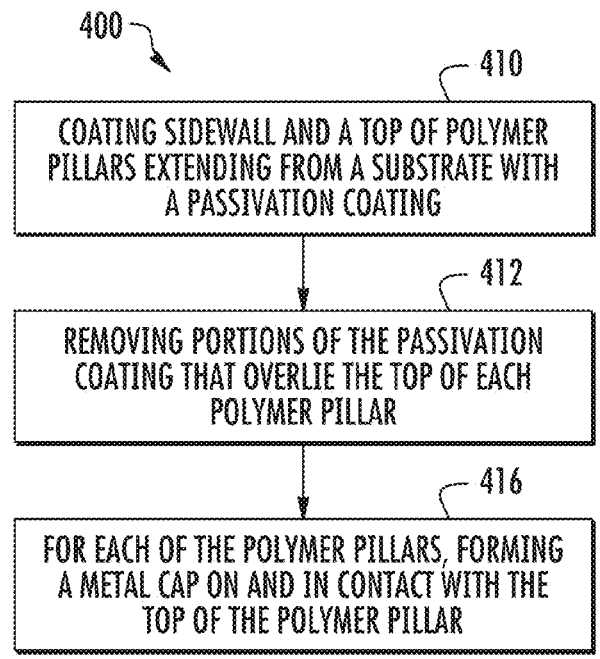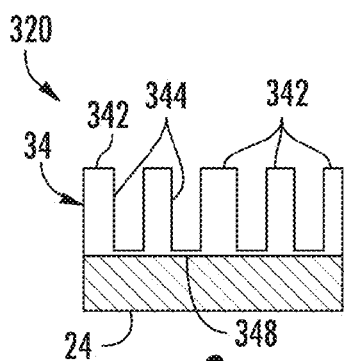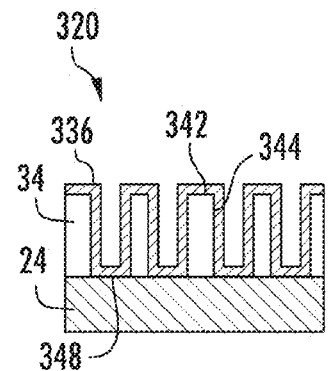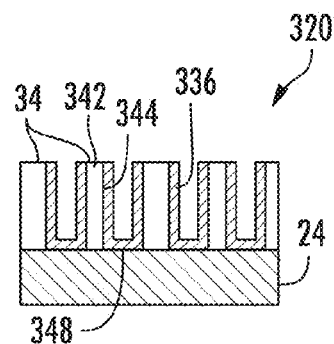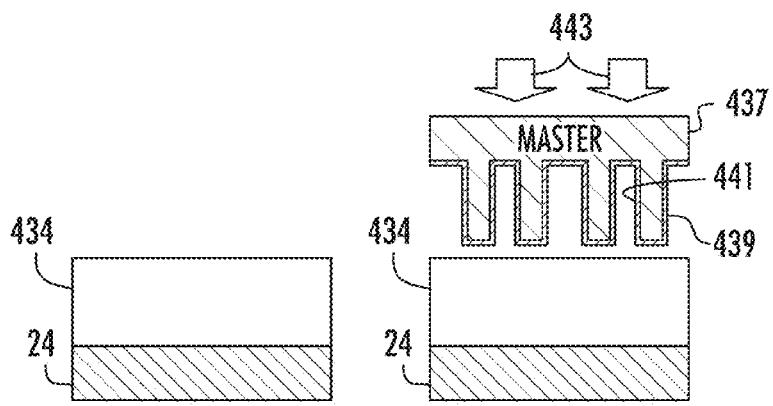

SELS NANO FINGER SIDEWALL COATING LAYER

BACKGROUND

Surface enhanced luminescence (SEL) is sometimes used for analyzing the structure of inorganic materials and complex organic molecules. SELS focuses electromagnetic radiation or light onto an analyte or solution containing an analyte, wherein the interaction between the light and the analyte is detected for analysis.

BRIEF DESCRIPTION OF THE DRAWINGS

FIG. 7 is a sectional view of a portion of another example SELS sensor.

FIG. 8 is a flow diagram of an example method for forming an SELS sensor.

FIG. 9 is a sectional view of an example substrate supporting example pillars for use in the example method of FIG. 8.

FIG. 10 is a sectional view of the substrate and pillars a FIG. 9 after being coated with a coating layer pursuant to the method of FIG. 8.

FIG. 11 is a sectional view of the substrate and pillars of FIG. 10 after those portions of the coating layer over tops of the pillars have been removed, ready for the forming of metallic caps as shown in FIG. 7.

FIG. 12 is a sectional view of an example substrate supporting an example mass of polymer material for use in forming the example substrate and example pillars of FIG. 9.

FIG. 13 is a sectional view of the example substrate supporting the example mass of polymer material of FIG. 12 ready for imprinting by a master to form the pillars of FIG. 9.

FIG. 14 is a sectional view of the example substrate supporting the example mass of polymer material during imprinting with the master.

DETAILED DESCRIPTION OF EXAMPLES

Figure 1:
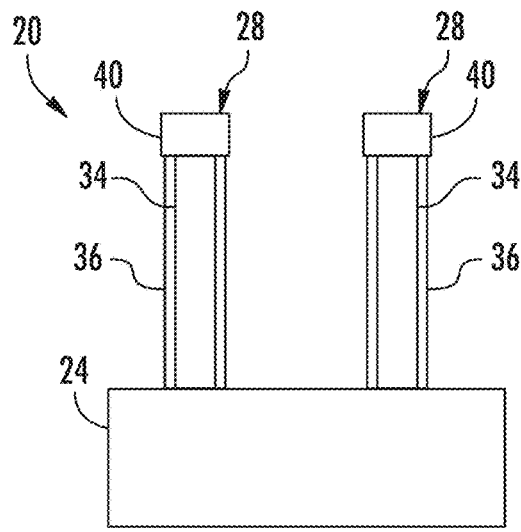
FIG. 1 is a sectional view of a portion of an example SELS sensor.

FIG. 1 is a sectional view of an example surface enhanced luminescence (SELS) sensor 20 that may be used for sensing the interaction between light and an analyte deposited upon sensor 20. In one implementation, sensor 20 facilitates testing or diagnosis using surface enhanced Raman spectroscopy (SERS). As will be described hereafter, sensor 20 comprises nano fingers form from polymer pillars, wherein the coating layer covers the sidewalls of the polymer pillars and wherein each of the pillars has a metal cap that is supported by and in contact with a top of each of the pillars. The coating layer reduces contamination of the metal and of the analyte being tested from the underlying material of the polymer pillars. Because the coating layer does not encapsulate a top of the polymer pillars, securement of the metal cap to the top of the polymer pillar is facilitated. In some implementations, the coating layer is further used to tune or control the rigidity of the polymer pillar.

Sensor 20 comprises substrate 24, and nano fingers 28. Substrate 24 comprises a base or foundation for supporting nano fingers 28. In one implementation, substrate 24 comprises a layer of silicon, quartz, glass or polymeric films such as polyethylene terephthalate (PET). In some implementations, substrate 24 may additionally comprise an interlayer of a dielectric material between the silicon substrate and nano fingers 28. Such an interlayer dielectric may be formed from a material such as $SiO_2$ TEOS, a passivation layer of SiC, silicon nitride etc. In other implementations, other interlayer dielectric materials may be utilized. In still other implementations, substrate 24 may be formed from other materials such as quartz, ceramics, polymers and other materials.

Nano fingers 28 comprise elongated comprise flexible columnar supports such as needles, fingers, particles or wires. In some implementations, such nano fingers 28 are formed from materials and/or are dimensioned so as to bend or flex towards and away from one another in response to applied electric fields. In one implementation, such nano fingers 28 have an aspect ratio of and at least 10:1 (a height of at least 10 times the thickness or diameter). In one implementation, such nano fingers 28 have a thickness or diameter between 50 nm and 100 nm, while, at the same time, having a height of at least 500 nm and, in one implementation, at least 700 nm. In some implementations, the nano fingers 28 are movable and are self-actuating, wherein such columnar structures bend or flex towards one another in response to micro-capillary forces so as to self-organize, wherein such bending facilitates close spacing between the structures for greater scattered radiation intensity.

As shown by FIG. 1, each of nano fingers 28 comprises pillar 34, coating layer 36 and metal 40. Pillar 34 comprises an elongate column formed from a polymer material. The polymer material facilitates the use of molding, imprinting or other fabrication techniques to form pillars 34. The polymer material further facilitates bending and flexing of pillars 34 and subsequently closing during use of sensor 20. Examples of polymer materials from which each pillar 34 may be formed include, but are not limited to, photo resist, PDMS, or a flexible material selected from the group, which includes both dielectric and non-dielectric materials, consisting of a highly cross-linked uv-curable or thermal-curable polymer, a highly cross-linked uv-curable or thermal-curable plastic, a polysiloxane compound, silicon, silicon dioxide, spin-on glass, a solgel material, silicon nitride, diamond, diamond-like carbon, aluminum oxide, sapphire, zinc oxide, and titanium dioxide.

Coating layer 36 comprises a thin layer or film of at least one passivation material that conforms to and coats the exterior side wall surfaces of pillar 34. In the example illustrated, coating layer 36 has a uniform thickness across a majority of a height of pillar 34. In one implementation, coating layer 34 has a substantially uniform thickness the entire height of pillar 34, wherein the thickness varies by less than 10% along the entire height. In one implementation, coating layer 36 has a thickness of at least 1 nm. In one implementation, coating layer 36 has a thickness of at least 1 nm and no greater than 20 nm.

In one implementation, coating layer 36 comprises a material that is less likely to emit contaminants or contaminate metal cap 40 during the fabrication or use of sensor 20 as compared to the material or materials of pillar 34. In one implementation, coating layer 36 comprises an organic material such as polytetrafluoroethylene, parylene or other conformal coating. In one implementation, coating layer 36 comprises at least one inorganic material. Examples of materials from which coating layer 36 may be formed include, but are not limited to, $SIO_2$, silicon nitride, titanium oxide, tantalum oxide, hafnium oxide, tungsten oxide, aluminum oxide, zirconium oxide etc. In one implementation, the materials chosen for coating layer 36 comprise materials that may be depositable by atomic layer deposition (ALD), physical vapor deposition (PVD), chemical vapor deposition (CVD) such as plasma enhanced chemical vapor deposition (PECVD). In yet other implementations, coating layer 36 may comprise other materials deposited or formed upon the exterior side wall surfaces of pillar 34 in other fashions.

In one implementation, coating layer 36 is applied directly to and in contact with the side wall surfaces of pillar 34. In one implementation, coating layer 36 is applied and adheres directly to pillar 34. In yet another implementation, coating layer 36 may be secured to the side wall surfaces of pillar 34 by an intermediate adhesive layer.

In some implementations, the material or materials chosen for coating layer 36, the chosen thickness for coating layer 36, the material or materials chosen for pillar 34 and the thickness for pillar 34 may be selected so as to tune or control the bendability or flexibility (rigidity) of each nano finger 28. For example, in some implementations, the thickness of pillar 34 may be reduced to a point of having too great a degree of flexibility or bendability, wherein the thickness and/or materials chosen for coating layer 36 serve to increase the rigidity of the final nano finger 28 such that the flexibility falls within an acceptable range. Likewise, in some implementations, the height of pillar 34 may be increased to a point of having to greater degree of flexibility or bend ability, wherein the thickness and/or materials chosen for coating layer 36 serve to increase the rigidity of the final nano finger 28 such that the flexibility falls within an acceptable range.

Metal cap 40 comprises a metallic structure formed on top of pillar 34 in direct contact with pillar 34. Because metal cap 40 is in direct contact with the top of pillar 34, metal cap 40 may have greater adherence to pillar 34, regardless of the material chosen for coating layer 36. In one implementation, metal cap 40 has a bottom surface that does not overlap or coper coating layer 36. Metal cap 40 has a top surface that is not covered by cover layer 36, so as to be exposed to the liquid to be tested. Although metal cap 40 is illustrated as being substantially rectangular, it should be appreciated that metal cap 40 may have a variety of different sizes and shapes. For example, in some implementations, metal cap 40 may be more spherical in shape.

Metal cap 40 comprises a metal material that enhances the intensity of electromagnetic radiation emitted as a result of the reaction of the analyte and the light impinging the analyte upon nano fingers 28. In one implementation, metal cap 40 comprises silver, gold, copper, platinum, aluminum, or combinations of these metals in the form of alloys or multilayer systems. In another implementation, metal cap 40 may comprise other metallic materials that provide such intensity enhancement. In the example illustrated, metal cap 40 is not covered or coated by coating layer 36.

Overall, coating layer 36 enhances the performance and shelf life of the nano fingers 28 by preventing contaminants from leaching out of the polymer of the pillars 34 and reducing the cleanliness of the metal cap 40. Direct chemisoption onto the clean metal of cap 40 provides robust coupling to enhance the plasmonic resonance of the device. Coating layer 36 may also improve the stiffness properties of nano fingers 28 such that nano fingers 28 may be more uniformly collapse. In some implementations, coating layer 36 is tuned for different solvents. For example, ethanol and water are the two example solvents that may be used during testing; however, with different finger stiffnesses and chemical protection of the polymer, the number of suitable solvents for the analyte during testing may be expanded.

Figure 2:
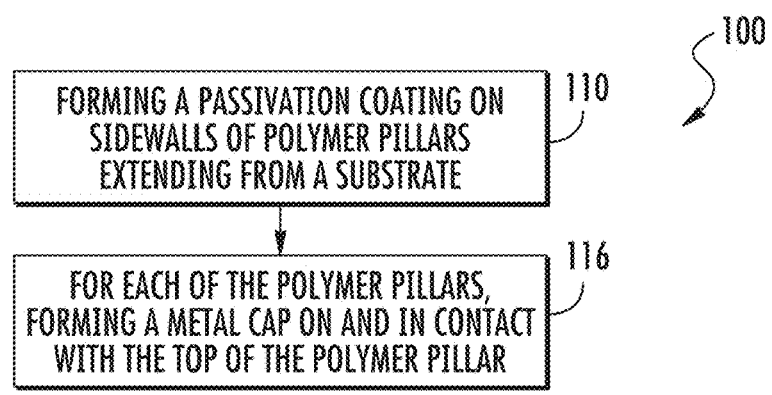
FIG. 2 is a flow diagram of an example method for forming an SELS sensor.

FIG. 2 is a flow diagram illustrating one example method 100 for forming a SELS sensor, such as SELS sensor 20 illustrated in FIG. 1. In one implementation, SELS sensor 20 comprises a surface enhance Raman spectroscopy (SERS) sensor. Although method 100 is described with respect to forming sensor 20, method 100 may also be utilized to form any of the sensors described hereafter in the present disclosure. As indicated by block 110, coating layer 36 is formed on the side walls of pillar 34 which extends from substrate 24. In one implementation, the coating layer 36 is formed on the side walls of pillar 34 using plasma enhanced chemical vapor deposition. In another implementation, the coating layer formed on the side walls of pillar 34 using atomic layer deposition. In yet other implementations, the coating layer 36 may be formed using other techniques. In one implementation, coating layer 36 is formed directly upon the outer side wall surfaces of pillar 34. In yet another implementation, an intermediate adhesive layer is first applied to the outer side wall surfaces of pillar 34, wherein coating layer 36 comprises a layer over the adhesive layer and held to pillar 34 by the adhesive layer.

As indicated by block 116, for each of the polymer pillars 34, metal cap 40 is formed on and in contact with the top of each polymer pillar 34. In one implementation, the forming of coating layer 36 on pillars 34 is controlled to limit an extent of coverage of coating 36 so as to not completely cover the top of pillar 34. In yet another implementation, portions of coating 36 extending over the top of pillar 34 are subsequently removed to expose the top of pillar 34 for direct contact with metal cap 40. In one implementation, metal cap 40 is deposited directly onto the top surface of each pillar 34 using a plasma coating deposition technique such as physical vapor deposition (PVD). In one implementation, metal cap 40 comprises a metal such as gold or silver. In yet other implementations, metal cap 40 may be formed or deposited on top of pillar 34 in other fashions with the same or other materials.

Figure 3:
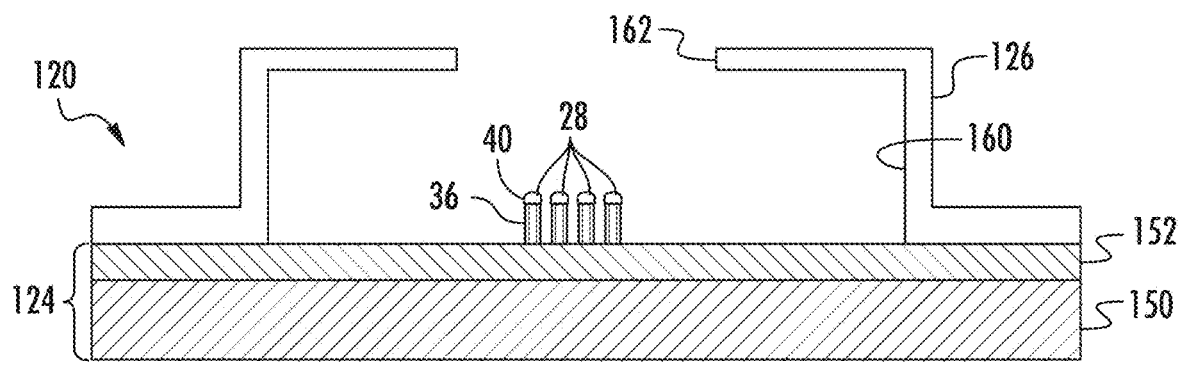
FIG. 3 is a sectional view of another example SELS sensor.

FIG. 3 is a sectional view illustrating another example SELS Sensor 120. Sensor 120 comprises substrate 124, housing 126 and nano fingers 28 described above. Substrate 124 is similar to substrate 24 described above except that substrate 124 is specifically illustrated as comprising base substrate layer 150 and substrate interlayer 152. Base substrate layer 150 comprises a foundation for apparatus 120, supporting interlayer 152. In one implementation, base substrate layer 150 comprises a layer of silicon. In other implementations, base substrate layer 150 may comprise other materials.

Interlayer 152 comprises a dielectric layer extending on top of layer 150 and supporting nano fingers 28. In the example illustrated, interlayer 152 is further sandwiched between housing 126 and layer 150. In other implementations, layer 152 is contained within housing 126, wherein housing 126 is directly in contact with layer 150. In one implementation, interlayer 152 comprises a layer formed from a material such as $SiO_2$ TEOS. In other implementations, other interlayer dielectric materials may be utilized.

Housing 126 comprises an enclosure or other structure extending about nano fingers 28 on substrate 124 and forming a chamber 160 for receiving and containing a liquid solution containing an analyte to be examined or tested. Housing 126 protects nano fingers 28 from exposure to the environment and reduces or prevents oxidation of surfaces of nano fingers 28 prior to use. Housing 126 may additionally reduce or prevent unintentional or premature exposure of nano fingers 28 to extraneous substances or an analyte that nano fingers 28 are intended to detect. Although housing 126 and substrate 124 are illustrated as forming a rectangular shaped interior chamber 160, in other implementations, chamber 160 may have other shapes. Although housing 126 is illustrated as having a top opening 162 through which the liquid is applied to chamber 160, in other implementations, opening 162 may alternatively extend through a side of housing 126. In some implementations, housing 126 may additionally support an integrated lens located for focusing light or laser light onto the tips of metal caps 40 of nano fingers 28.

Figure 4A:
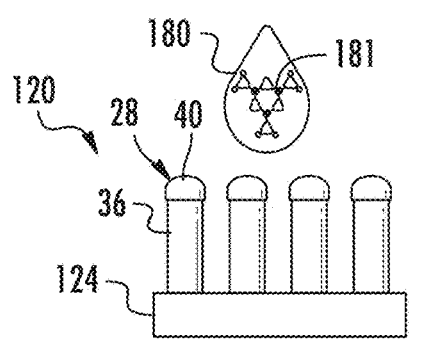
FIG. 4A is a side view of a portion of the example sensor of FIG. 3.
Figure 4B:
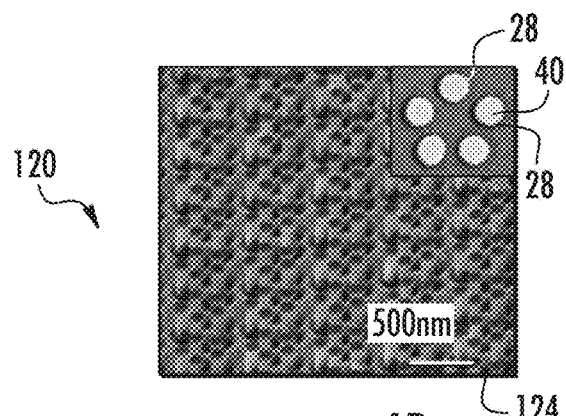
FIG. 4B is a top view of a portion of the example sensor of FIG. 4A.
Figure 5A:
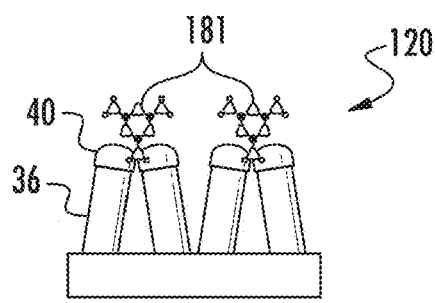
FIG. 5A is a side view of a portion of the example sensor of FIG. 3 following closing of the example nano fingers.
Figure 5B:
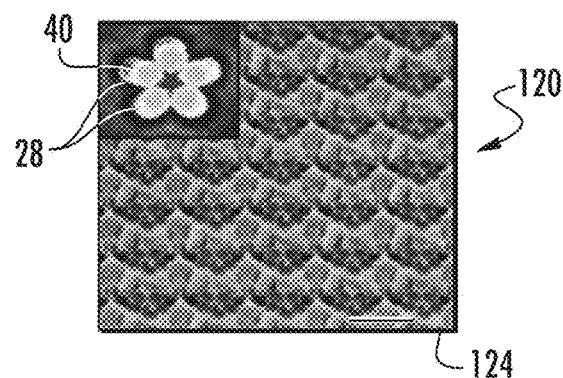
FIG. 5B is a top view of the portion of the example sensor of FIG. 5A following closing of the example nano fingers.

Nano fingers 28 are described above. FIGS. 4A and 4B illustrate portions of the example sensor 120 prior to closing of nano fingers 28. FIGS. 5A and 5B illustrate the bending or flexing of nano fingers 28, the closing of nano fingers 28 to capture analyte molecules of interest to be sensed. As shown by FIGS. 4A and 4B, nano fingers 28 are substantially vertical, having the illustrated spacing between the individual nano fingers 28. As further shown by FIG. 4A, liquid solution 180 containing analyte molecules 181 (schematically shown) are deposited on and about nano fingers 28. The liquid solution 180 may cover and coat nano fingers 28.

As shown by FIGS. 5A and 5B, the liquid solution 180 applied in FIGS. 4A and 4B is evaporated, leaving the remaining analyte molecules 181. The evaporation may result in nano fingers 28 flexing or bending towards one another so as to capture or entrap the analyte molecules 181 therebetween. In one implementation, capillary forces resulting from the evaporation of liquid solution 180 may cause nano fingers 28 to flex or bend towards one another or close. The retained analyte molecules 181 and the closed nano fingers 28 with metal caps 40 intensify signals or light emitted from sensor 120 in response to interactions between the light or laser impinging nano fingers 28 and analyte molecules 181.

Figure 6:
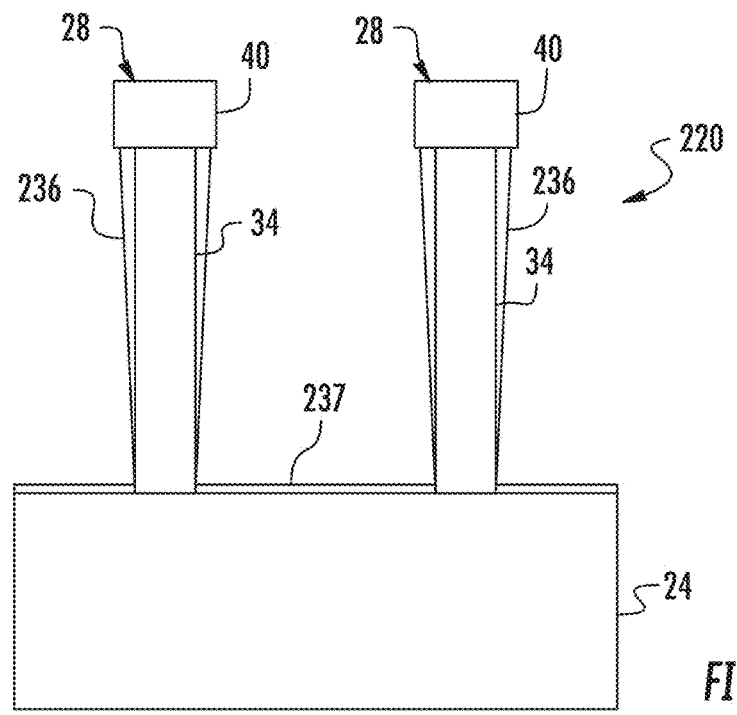
FIG. 6 is a sectional view of a portion of another example SELS sensor.

FIG. 6 is a sectional view of another example SELS sensor 220. Sensor 220 is similar to sensor 20 except that sensor 220 comprises coating layer 236 in place of coating layer 36. Those remaining components of sensor 220 which correspond to components of sensor 20 are numbered similarly. Coating layer 236 is similar coating layer 36 except that coating layer 236 has a non-uniform or irregular thickness in a direction parallel to our along along the vertical height of pillars 34. In the example illustrated, coating layer 236 has a thickness that decreases from adjacent the top of pillars 34 towards substrate 24. As a result, lower portions of each nano finger 28 are less rigid as compared to the lower portions of nano fingers 28 of sensor 20. The lower rigidity at the base or lower portion of each of nano fingers 28 provided by coating layer 236 may enhance the ability of nano fingers 28 to flex or bend when closing as shown in FIGS. 5A and 5B.

In the example illustrated, coating layer 236 has a uniform thickness about the vertical centerline of impeller 34, but wherein the thickness gradually and linearly decreases as coating 236 approaches substrate 24. In one implementation, a upper portions (such as above the vertical midpoint of pillars 34) of coating layer 236 have a thickness of greater than 10 nm, and in one implementation, greater than 15 nm while lower portions (such as below the vertical midpoint of pillars 34) of coating layer 236 have a thickness of less than 10 nm, and in one implementation, less than 5 nm. In such a limitation, coating layer 236 extends from metal cap 40 only down to the top of substrate 24 to completely encompass all side surfaces of pillars 34 for contamination reduction.

In other implementations, coating layer 236 and have other thickness profiles. For example, in other implementations, coating layer 236 may extend along selected portions of the side surfaces of pillars 34. In some implementations, coating layer 236 may terminate prior to reaching substrate 24. In some implementations, instead of a linear sloped thickness profile, coating layer 236 may alternatively undergo thickness variations are changes in a stepped or stepwise manner vertically along pillars 34.

As illustrated by broken lines, in some implementations, sensor 220 may additionally comprise coating layer 237 formed upon the upper surface of substrate 24, between nano fingers 28 and about nano fingers 28. In some implementations, coating layer 237 is the same material or materials as coating layer 36. In one implementation, coating layer 236 is formed upon substrate 24 independent of the formation of coating layer 26 on the side wall surfaces of pillars 34. In yet another implementation, coating layer 237 concurrently formed upon substrate 24 with the deposition of coating layer 236 on the side wall surfaces of pillars 34. For example, in one of limitation, coating layers 236 and 237 may be both formed at the same time by plasma enhanced chemical vapor deposition or atomic layer deposition.

FIG. 7 is a sectional view illustrating another example SELS sensor, sensor 320. Sensor 320 is similar to sensor 20 described above except that sensor 320 comprises coating layer 336 in place of coating layer 36. Coating layer 336 is similar coating layer 36 except that coating layer 336 is specifically illustrated as continuously extending along side wall surfaces of a first pillar 34, across the upper surface of substrate 24 and a long side wall surfaces of a second consecutive pillars 34. In the example illustrated, coating layer 336 continuously extends from adjacent metal cap 40 of one nano finger 28 to adjacent a metal cap 40 of another nano finger 28. In the example illustrated, portion of the coating layer 336 extending parallel to or adjacent to the upper surface of substrate 24 may have a greater thickness as compared to the thickness of coating layer 336 extending along the side wall surfaces of pillars 34. The remaining components of sensor 320 which correspond to points of sensor 20 are numbered similarly.

FIG. 8 is a flow diagram of an example method 400 that may be utilized to form an SELS sensor, such as SELS sensor 320. The various stages of sensor 320 formed pursuant to method 400 are illustrated in FIGS. 9-11 and FIG. 7. Although method 400 is described with respect to forming sensor 320, method 400 may likewise be utilized to form other described sensors, such as sensors 120 are 220. For example, method 400 may be utilized to form a sensor wherein the coating layer has a non-uniform thickness along the vertical height of the respective pillars as described above respect to sensor 220.

As indicated by block 410 and illustrated by FIGS. 9 and 10, polymer pillars 34 extending from the substrate 24 (as shown by 9) are coated with a coating layer 336 (shown in FIG. 10). The coating 336 continuously extends across and over each of the pillars 34, across the tops 342, and along side wall surfaces 344 of each pillar 34. The coating layer 336 further continuously extends between such pillars 34 across the top surface 348 of substrate 24. In some implementations, depending upon the particular manner in which pillars 34 were formed, the material that form pillars 34 may extend along the top surface 348 of substrate 24, wherein coating layer 336 coats the upper surface of this layer on substrate 24 remaining from the formation of pillars 34. The continuous integral layer, a single unitary homogenous layer or a multitude of stacked homogenous layers, is uninterrupted as it extends along the side wall surfaces 344 of multiple pillars 34, across the tops 342 of multiple pillars 34 and across and between the floors of such pillars, the top or upper surface 348 of substrate 24. In one implementation, coating layer 336 is formed through plasma enhanced chemical vapor deposition. In another implementation, coating layer 336 is formed as multiple molecular layers deposited by atomic layer deposition. In one implementation, the single layer or multiple stacked layers have a thickness of at least 1 nm. In one implementation, the single layer or multiple stacked layers have a thickness of at least 1 nm and less than or equal to 20 nm.

As indicated by block 412 and illustrated by FIG. 11, portions of coating layer 336 that overlie the top 342 of each pillar 342 are removed so as to expose the top or upper surface 342 of each pillar 34 with the coating layer 336 on the side wall surfaces of pillars 34 being left in place or maintained. In one implementation, those portions of coating layer 336 that overlie the top 342 of each pillar 342 are removed by a blanket etch back process, wherein the top coat on top 342 is etched away but wherein the portion of coating layer 336 along side wall surfaces 344 are retained. For example, in one implementation, the blanket extract process may comprise a CMOS spacer formation similar involving blanket etch back through reactive ion etch or plasma etch process by a fluorine or chlorine-containing gases (e.g., $CF_4$, $CCl_4$ etc.). In other implementations, those portions of coating 336 over top surfaces 342 of pillars 34 may be selectively removed while leaving force of coating layer 336 along side wall surfaces 344 using other material removal techniques.

As indicated by block 416 and illustrated by FIG. 7, metal cap 40 is formed on each of pillars 34 such a metal cap 40 is in direct contact with the top 342 of its associated pillar 34. Metal cap 40 is described above. Because metal cap 40 is formed directly on and in contact with exposed top surface 342 of its associated pillar 34, metal cap 40 may be more securely and reliably retained or joined to the respective pillar 34. Because those portions of coating layer 336 that overlie top surface 342 are removed, the variety and number of materials that may be utilized for coating layer 336 is enlarged as coating 336 does not extend between pillar 34 and each metal cap 40 and cannot interfere with or has a reduced impact with the securement of each metal cap 40 to the respective pillar 34.

FIGS. 12-14 illustrate one example method for forming and providing substrate 24 and pillars 34 as provided in FIG. 9 as part of method 400. FIGS. 12-14 illustrate the forming of substrate 24 and pillars 34 by an imprinting process. As shown by FIG. 12, a polymer mass 434 is deposited upon or otherwise joined to substrate 24. In one implementation, the polymer mass 434 comprises an ultraviolet resist material. For example, in one implementation, the polymer mass 434 comprises a polymer resist material such as a UV curable acrylate. In other implementations, the polymer mass may comprise a material or multiple materials selected from a group of materials consisting of a flexible material selected from the group, which includes both dielectric and non-dielectric materials, consisting of a highly cross-linked uv-curable or thermal-curable polymer, a highly cross-linked uv-curable or thermal-curable plastic, a polysiloxane compound, silicon, silicon dioxide, spin-on glass, a solgel material, silicon nitride, diamond, diamond-like carbon, aluminum oxide, sapphire, zinc oxide, and titanium dioxide.

As illustrated by FIGS. 13 and 14, while the polymer mass 434 is in an impressionable or soft moldable state, the polymer mass 434 is imprinted by a master 437. In one implementation, master 437 comprises a plurality of projections 439 which are spaced or which provide openings 441 corresponding in size, shape and location of the to be formed pillars 34 (described above). In one implementation, as indicated by arrows 443, master 437 is imprinted into polymer mass 434 allowing the material of mass 434 to flow about and surround each of projections 439. While the material of mass 434 surrounds projections 439, the polymer mass 434 is allowed to solidify or harden. In one implementation, the polymer mass 434 is cured with an ultraviolet light. Thereafter, the master 437 is removed, leaving the substrate 24 and pillars 34 shown in FIG. 9, ready for the remaining steps of method 400 to be carried out.

FIGS. 12-14 illustrate one example method for providing substrate 24 and pillars 34 shown in FIG. 9. In other implementations, pillars 34 may be formed upon substrate 24 in other fashions. For example, in other implementations, pillars 34 may be formed by other etching processes, other molding processes, other material removal processes, or by material additive processes such as three-dimensional printing.

Although the present disclosure has been described with reference to example implementations, workers skilled in the art will recognize that changes may be made in form and detail without departing from the spirit and scope of the claimed subject matter. For example, although different example implementations may have been described as including one or more features providing one or more benefits, it is contemplated that the described features may be interchanged with one another or alternatively be combined with one another in the described example implementations or in other alternative implementations. Because the technology of the present disclosure is relatively complex, not all changes in the technology are foreseeable. The present disclosure described with reference to the example implementations and set forth in the following claims is manifestly intended to be as broad as possible. For example, unless specifically otherwise noted, the claims reciting a single particular element also encompass a plurality of such particular elements. The terms "first", "second", "third" and so on in the claims merely distinguish different elements and, unless otherwise stated, are not to be specifically associated with a particular order or particular numbering of elements in the disclosure.

What is claimed is:

1. A method for forming a surface enhanced luminescence (SELS) sensor, the method comprising:
   forming polymer pillars that extend from a substrate;
   coating sidewalls of the polymer pillars with a coating layer after the polymer pillars are formed;
   removing portions of the coating layer that overlie tops of the polymer pillars; and forming a metal cap on and in contact with each top of the tops of the polymer pillars after the portions of the coating layer that overlie tops of the polymer pillars are removed.

2. The method of claim 1, wherein the polymer pillars are coated with the coating layer using plasma enhanced chemical vapor deposition (PECVD).

3. The method of claim 1 further comprising forming the polymer pillars by imprinting a polymer mass with a master defining the polymer pillars.

4. The method of claim 3, wherein the polymer mass comprises an ultraviolet photoresist and wherein the method further comprises:
   curing the ultraviolet photoresist while the ultraviolet photoresist is imprinted by the master; and
   withdrawing the master.

5. The method of claim 1, wherein the coating layer includes at least one passivation material.

6. A method comprising:
   forming polymer pillars by imprinting a polymer mass on a substrate with a master defining the polymer pillars;
   coating sidewalls and tops of the polymer pillars extending from the substrate with a coating layer after the polymer pillars are formed; and
   removing portions of the coating layer that overlie the tops of the polymer pillars; and
   forming a metal cap on and in contact with each top of the tops of the polymer pillars after the portions of the coating layer that overlie the tops of the polymer pillars are removed.

7. The method of claim 6, wherein the coating layer comprises at least one material selected from a group of materials consisting of $SiO_2$, SiN and polytetrafluoroethylene.

8. The method of claim 6, wherein the coating layer includes at least one passivation material.

* * * * *